United States Patent
Sakamoto et al.

(10) Patent No.: US 8,518,751 B2
(45) Date of Patent: Aug. 27, 2013

(54) METHOD FOR MANUFACTURING SEMICONDUCTOR DEVICE INCLUDING REMOVING A RESIN BURR

(75) Inventors: Ken Sakamoto, Tokyo (JP); Taketoshi Shikano, Tokyo (JP); Mitsugu Tanaka, Tokyo (JP); Taishi Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 56 days.

(21) Appl. No.: 13/213,593

(22) Filed: Aug. 19, 2011

(65) Prior Publication Data

US 2012/0196405 A1  Aug. 2, 2012

(30) Foreign Application Priority Data

Jan. 31, 2011  (JP) .................................. 2011-017877

(51) Int. Cl.
  *H01L 21/56*  (2006.01)
(52) U.S. Cl.
  USPC ........................................................ 438/123
(58) Field of Classification Search
  CPC ......... H01L 23/50; H01L 21/02; H01L 21/56; H01L 21/60; H01L 23/488
  USPC ....................................................... 438/123
  See application file for complete search history.

(56) References Cited

U.S. PATENT DOCUMENTS

| | | | |
|---|---|---|---|
| 5,637,914 A | 6/1997 | Tanaka et al. | |
| 5,763,949 A * | 6/1998 | Woodworth et al. | 257/712 |
| 5,886,397 A * | 3/1999 | Ewer | 257/667 |
| 5,939,775 A | 8/1999 | Bucci et al. | |
| 6,338,984 B2 * | 1/2002 | Minamio et al. | 438/123 |
| 2001/0041384 A1 * | 11/2001 | Ohgiyama et al. | 438/111 |

FOREIGN PATENT DOCUMENTS

| | | |
|---|---|---|
| DE | 197 36 895 A1 | 4/1998 |
| JP | 60-123047 | 7/1985 |
| JP | 62-198143 | 9/1987 |
| JP | 62-247553 | * 10/1987 |
| JP | 63-151056 | 6/1988 |
| JP | 63-197363 | 8/1988 |
| JP | 2-202045 | 8/1990 |
| JP | 3-275224 | 12/1991 |
| JP | 4-42565 | * 2/1992 |
| JP | 4-164356 | 6/1992 |
| JP | 9-276952 | 10/1997 |

OTHER PUBLICATIONS

Office Action issued Jul. 3, 2012 in German Patent Application No. 10 2011 086 312.5 with English language translation.
US 5,905,304, 05/1999, Peter R. Ewer et al. (withdrawn).

* cited by examiner

*Primary Examiner* — Hsien Ming Lee
*Assistant Examiner* — Walter H Swanson
(74) *Attorney, Agent, or Firm* — Oblon, Spivak, McClelland, Maier & Neustadt, L.L.P.

(57) ABSTRACT

A method of manufacturing a semiconductor device comprises: preparing a lead frame including a package external region and a package internal region, a burred surface being provided at a top end of a side of the lead frame, and a fracture surface being provided in the vicinity of the top end of the side; chamfering the top end of the side in the package external region; mounting a semiconductor element on the lead frame and sealing the semiconductor element with mold resin in the package internal region; and removing resin burr provided on the side of the lead frame in the package external region after the chamfering and the sealing.

5 Claims, 7 Drawing Sheets

SHORTEST DISTANCE

METHOD FOR MANUFACTURING SEMICONDUCTOR DEVICE INCLUDING REMOVING A RESIN BURR

BACKGROUND OF THE INVENTION

1. Field of the Invention

The present invention relates to a method for manufacturing a resin-sealed type semiconductor device that performs transfer molding.

2. Background Art

Lead frames are formed by punching them out from a metal sheet by means of a progressive die. In that case, a burred surface, fracture surface and rolled-over surface are provided on a side of the lead frame. The presence of this fracture surface or the like strengthens the adhesion of the resin burr to the lead frame, and it is therefore difficult to remove the resin burr.

Thus, a method is proposed which provides a substance having a low level of adhesion to the mold resin in a dam segment to improve resin burr removing characteristics (e.g., see FIG. 11 of Japanese Patent Laid-Open No. 4-164356). However, resin burr cannot be easily removed using this method, either. There is also a problem that this method takes time and cost, and it is hard to incorporate the method into actual manufacturing steps.

On the other hand, another method is proposed which removes a burred surface or fracture surface by vertically shaving a side of the lead frame (e.g., see Japanese Patent Laid-Open No. 2-202045). This allows resin burr to be easily removed.

SUMMARY OF THE INVENTION

As the size of devices becomes smaller, the distance (spatial distance) between terminals of lead frames becomes smaller, resulting in a problem that discharge occurs between the terminals of the lead frames. The method of vertically shaving the side of lead frames also involves the problem of discharge.

In view of the above-described problems, an object of the present invention is to provide a method of manufacturing a semiconductor device which allows resin burr to be easily removed and can suppress the occurrence of discharge between the lead terminals.

According to the present invention, a method of manufacturing a semiconductor device comprises: preparing a lead frame including a package external region and a package internal region, a burred surface being provided at a top end of a side of the lead frame, and a fracture surface being provided in the vicinity of the top end of the side; chamfering the top end of the side in the package external region; mounting a semiconductor element on the lead frame and sealing the semiconductor element with mold resin in the package internal region; and removing resin burr provided on the side of the lead frame in the package external region after the chamfering and the sealing.

The present invention allows resin burr to be easily removed and can suppress the occurrence of discharge between the lead terminals.

Other and further objects, features and advantages of the invention will appear more fully from the following description.

DETAILED DESCRIPTION OF THE PREFERRED EMBODIMENTS

A method of manufacturing a semiconductor device according to the embodiments of the present invention will be described with reference to the drawings. The same components will be denoted by the same symbols, and the repeated description thereof may be omitted.

First Embodiment

Figure 1:
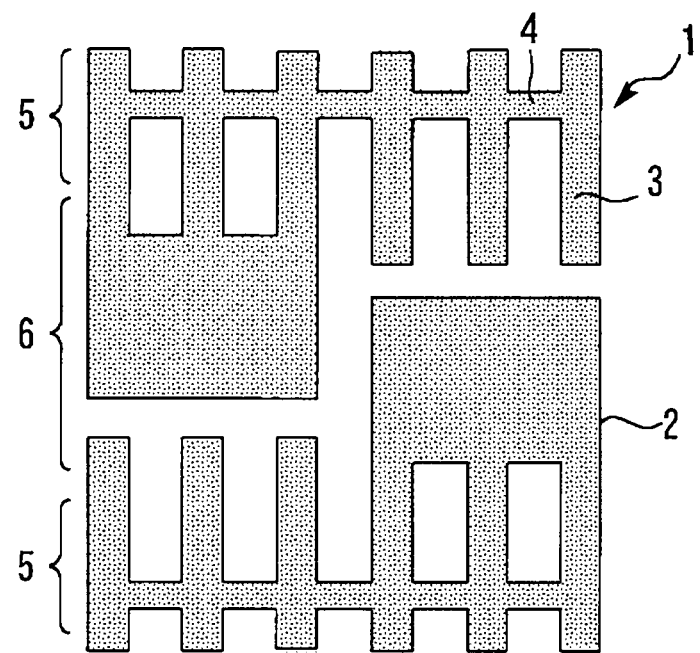
FIG. 1 is a top view showing a lead frame used in the first embodiment of the present invention.

With reference now to the attached drawings, a method of manufacturing a semiconductor device according to a first embodiment of the present invention will be explained below. FIG. 1 is a top view showing a lead frame used in the first embodiment of the present invention. A lead frame 1 includes a die pad 2, a lead terminal 3 and a tie bar 4. The region of the lead frame 1 is divided into a package external region 5 which is not resin-sealed in later steps and a package internal region 6 which is resin-sealed in later steps.

Figure 2:
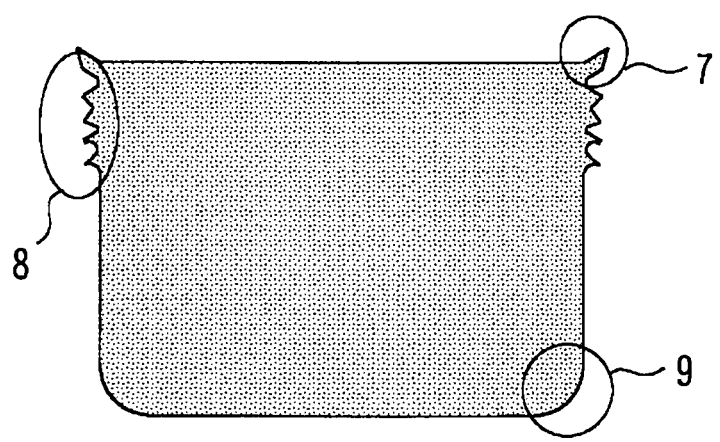
FIG. 2 is a cross-sectional view illustrating a lead terminal of the lead frame in FIG. 1.

FIG. 2 is a cross-sectional view illustrating a lead terminal of the lead frame in FIG. 1. The lead frame 1 is formed by punching it out from a metal sheet using a progressive die. In that case, a burred surface 7 is provided at a top end of the side of the lead frame 1, a fracture surface 8 is provided in the vicinity of the top end of the side and a rolled-over surface 9 is provided at the bottom end of the side. In the side of the lead frame 1, the shear surface represents approximately 70% of the frame thickness and the fracture surface 8 represents approximately 30% of the frame thickness.

Figure 3:
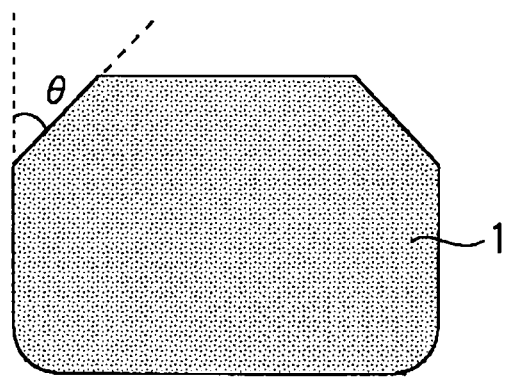
FIGS. 3 and 6 are cross-sectional views for illustrating a method of manufacturing a semiconductor device according to the first embodiment of the present invention.
Figure 4:
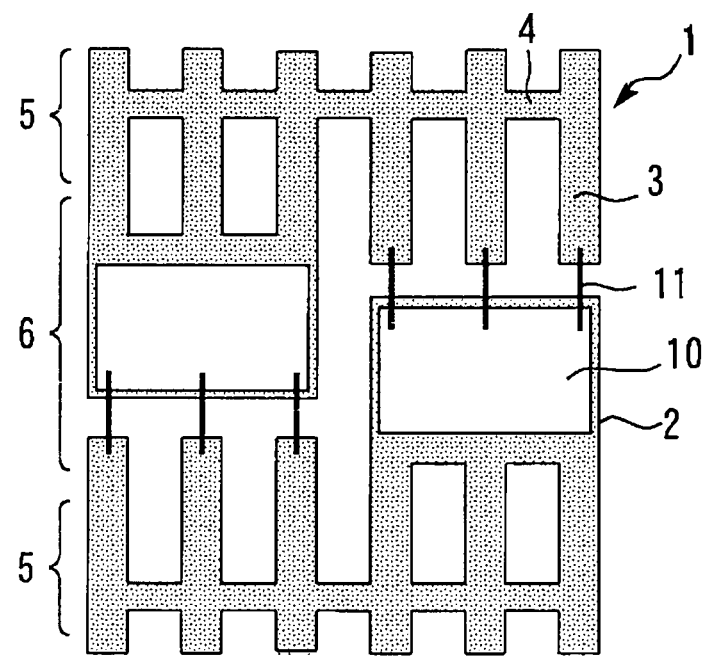
FIGS. 4 and 5 are top views for illustrating a method of manufacturing a semiconductor device according to the first embodiment of the present invention.
Figure 5:
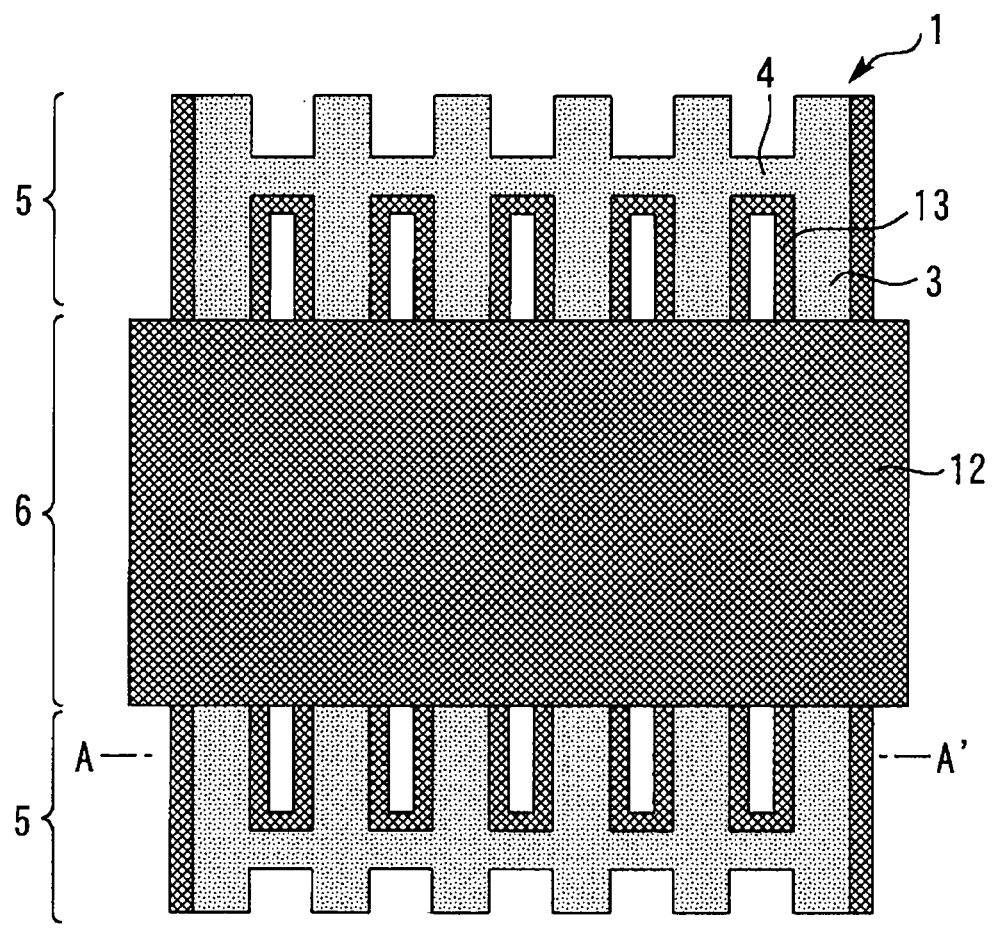
Figure 6:
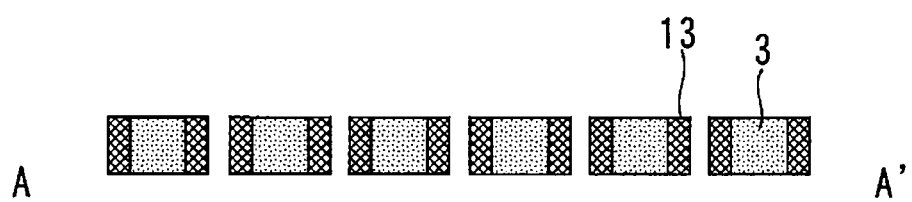

FIGS. 3 and 6 are cross-sectional views for illustrating a method of manufacturing a semiconductor device according to the first embodiment of the present invention. FIGS. 4 and 5 are top views for illustrating a method of manufacturing a semiconductor device according to the first embodiment of the present invention.

First, as shown in FIG. 3, portions of the package external region 5 provided with the burred surface 7 and the fracture surface 8 of the lead frame 1 are chamfered (C-surface working). However, in the package internal region 6, the burred surface 7, fracture surface 8 and rolled-over surface 9 are left as they are.

An allowable angle θ of chamfering is 3° to 87°. However, the angle θ within which chamfering can be performed most easily is 45°. Specific examples of chamfering methods include cutting of corners of the lead frame 1 using a lead die, deformation of corners of the lead frame 1 under a clamp pressure of the lead die, shaving and grinding using a file.

Next, as shown in FIG. 4, a semiconductor element 10 such as an IGBT (Insulated Gate Bipolar Transistor) or diode is mounted on the die pad 2 of the lead frame 1 in the package internal region 6 by means of solder. The semiconductor element 10 and the lead terminals 3 are then connected together via wires 11. After that, as shown in FIG. 5 and FIG. 6, the semiconductor element 10 and the wires 11 are sealed with mold resin 12. In this case, resin burr 13 is provided on the side of the lead frame 1 in the package external region 5.

Next, the resin burr 13 is removed through electrolytic stripping in an alkaline solution or by jetting high pressure water or the like. The semiconductor device according to the present embodiment is manufactured with the above configuration.

As described above, the present embodiment applies chamfering to the portions of the lead frame 1 in the package external region 5 provided with the burred surface 7 and fracture surface 8. This eliminates catching starting points of the resin burr 13, and can thereby easily remove the resin burr 13 by means of electrolytic deburring or water pressure deburring. Therefore, it is possible to improve moldability of the lead terminal 3 and reduce non-soldered parts of mold solder plating.

Furthermore, by leaving the burred surface 7 or the like in the package internal region 6, it is possible to improve catchability or adhesion of the mold resin 12 and suppress resin crack or stripping which starts from the interface between the lead frame 1 and mold resin 12.

Figure 7:
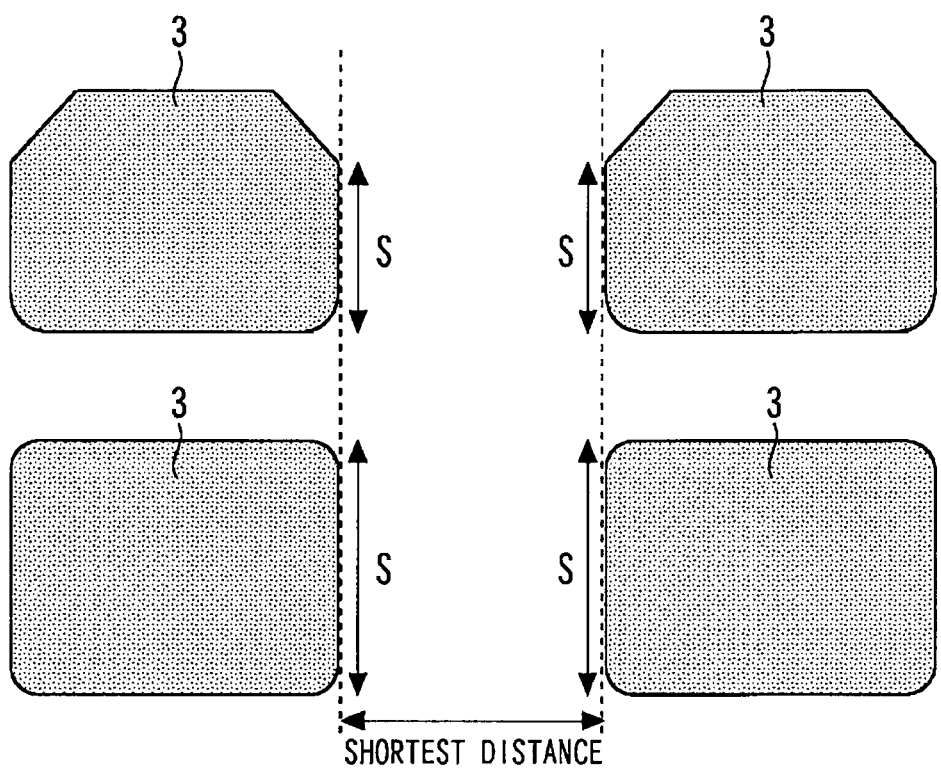
FIG. 7 is a cross-sectional view for illustrating the areas of the side of lead terminals located at the shortest distances from each other.

Furthermore, FIG. 7 is a cross-sectional view for illustrating the areas of the side of lead terminals located at the shortest distances from each other. The upper figure shows the first embodiment and the lower figure shows a comparative example. While chamfering is performed in the first embodiment, chamfering is not performed in the comparative example. The area S is the area of the side of the lead terminal 3 located at the shortest distance between the lead terminals 3. The first embodiment can reduce the area S more than the comparative example. Therefore, even when the distance between the lead terminals 3 is reduced, it is possible to suppress the occurrence of discharge between the lead terminals 3. This makes it possible to reduce the size of the device.

Figure 8:
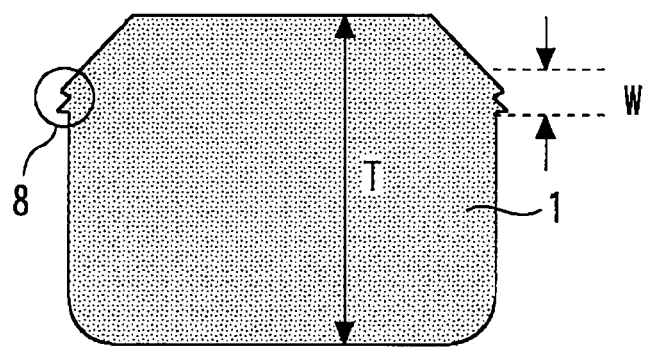
FIG. 8 is a cross-sectional view for illustrating modification example 1 of the method of manufacturing a semiconductor device according to the first embodiment of the present invention.

FIG. 8 is a cross-sectional view for illustrating modification example 1 of the method of manufacturing a semiconductor device according to the first embodiment of the present invention. When the chamfering accuracy is poor, the fracture surface 8 may remain after the chamfering. If a width W of the remaining side of the fracture surface 8 in the vertical direction is reduced to 10% or less of a frame thickness T, the resin burr 13 can be easily removed in the next step.

Figure 9:
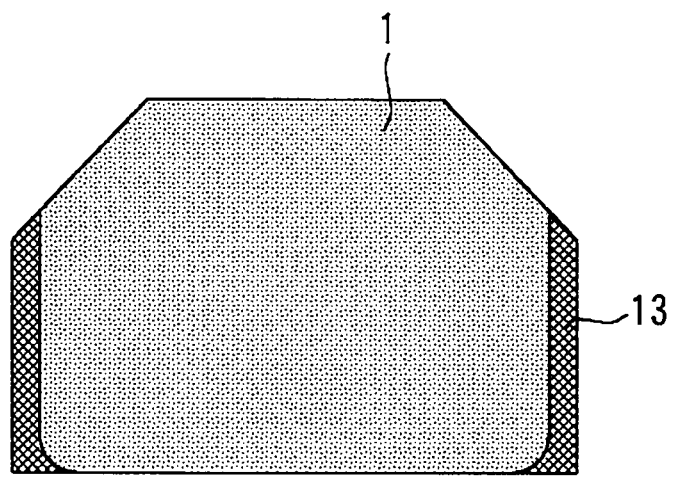
FIG. 9 is a cross-sectional view for illustrating modification example 2 of the method of manufacturing a semiconductor device according to the first embodiment of the present invention.

FIG. 9 is a cross-sectional view for illustrating modification example 2 of the method of manufacturing a semiconductor device according to the first embodiment of the present invention. The portion of the lead frame 1 provided with the burred surface 7 and the fracture surface 8 may also be chamfered after sealing it with the mold resin 12. By removing the portion of the resin burr 13 strongly adhering to the lead frame 1 through chamfering, the remaining resin burr 13 can be easily removed in the next step.

Second Embodiment

Figure 10:
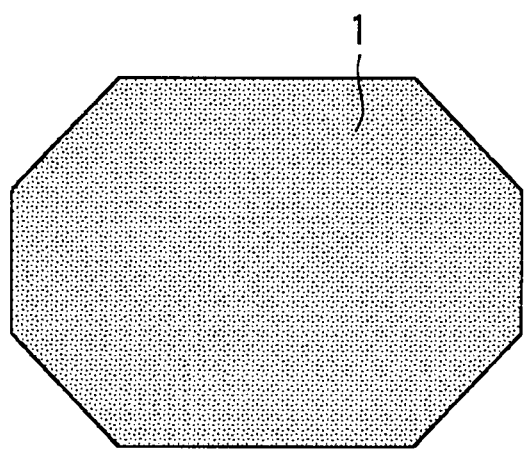
FIG. 10 is a cross-sectional view for illustrating a method of manufacturing a semiconductor device according to a second embodiment of the present invention.

FIG. 10 is a cross-sectional view for illustrating a method of manufacturing a semiconductor device according to a second embodiment of the present invention. In the present embodiment, the portion of the package external region 5 provided with the rolled-over surface 9 of the lead frame 1 is also chamfered. This makes it possible to reduce the area of the side of the lead terminal 3 located at the shortest distance between the lead terminals 3 more than the first embodiment. Therefore, it is possible to further suppress the occurrence of discharge between the lead terminals 3.

Third Embodiment

Figure 11:
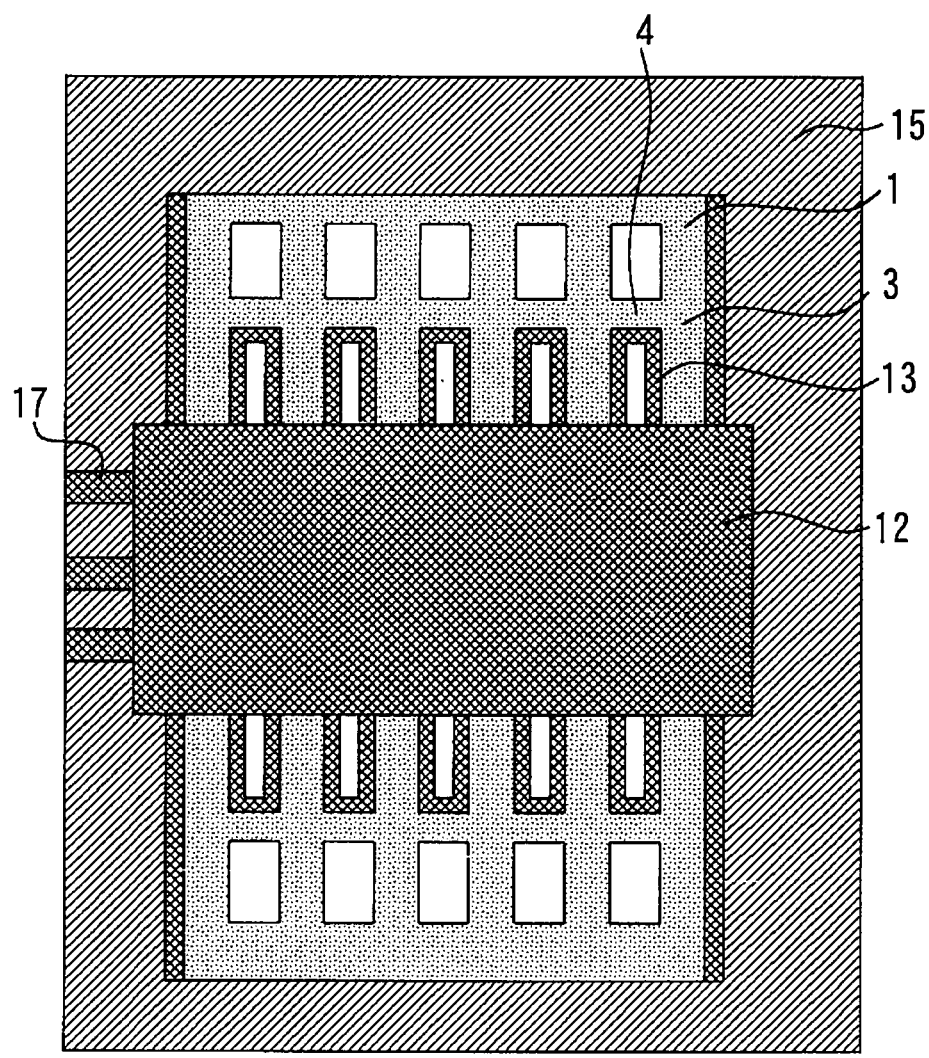
FIG. 11 is a top view for illustrating a method of manufacturing a semiconductor device according to a third embodiment of the present invention.
Figure 12:
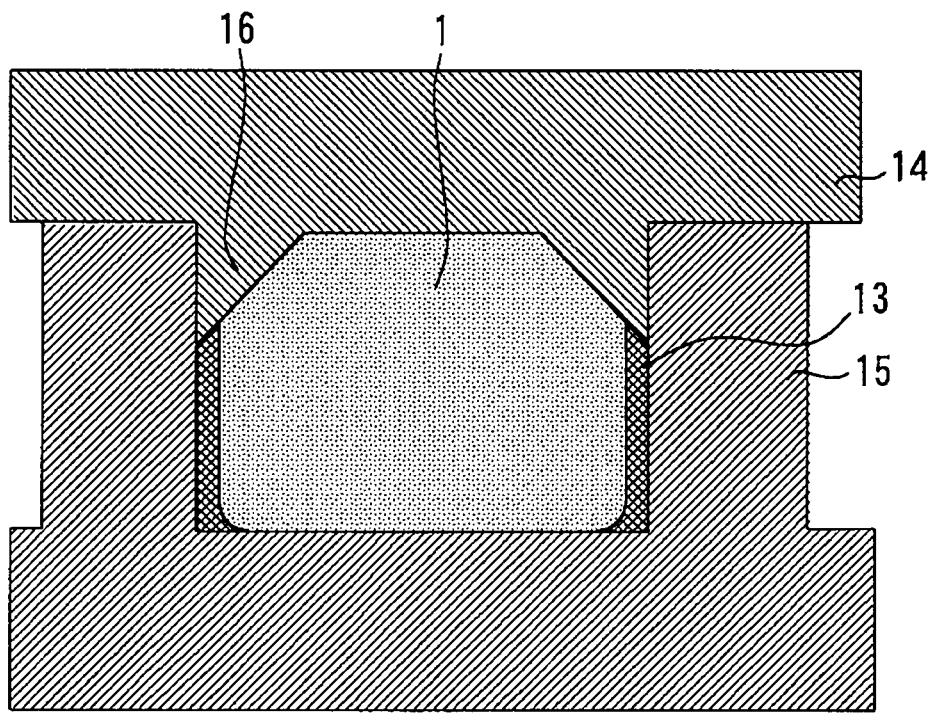
FIG. 12 is a partially enlarged cross-sectional view thereof.

FIG. 11 is a top view for illustrating a method of manufacturing a semiconductor device according to a third embodiment of the present invention and FIG. 12 is a partially enlarged cross-sectional view thereof.

When the device is sealed with mold resin 12, an upper die 14 and a lower die 15, which are mold dies, are used. First, the lead frame 1 is placed on the lower die 15. Next, the lead frame 1 is sandwiched between the upper die 14 and the lower die 15. When clamping this mold die, chamfering is simultaneously performed by pressing protrusions 16 of the upper die 14 against corners of the lead frame 1 and causing the corners to deform. After that, the mold resin 12 is injected between the upper die 14 and the lower die 15 from runner gates 17.

By performing resin sealing and chamfering simultaneously, it is possible to reduce intermediate materials, the number of man-hours and time, and thereby reduce working cost. However, implementing the present embodiment requires that there be no influence on the semiconductor element 10, that positioning of the lead frame 1 be sufficient and that chamfering through the protrusions 16 be easy.

Fourth Embodiment

Figure 13:
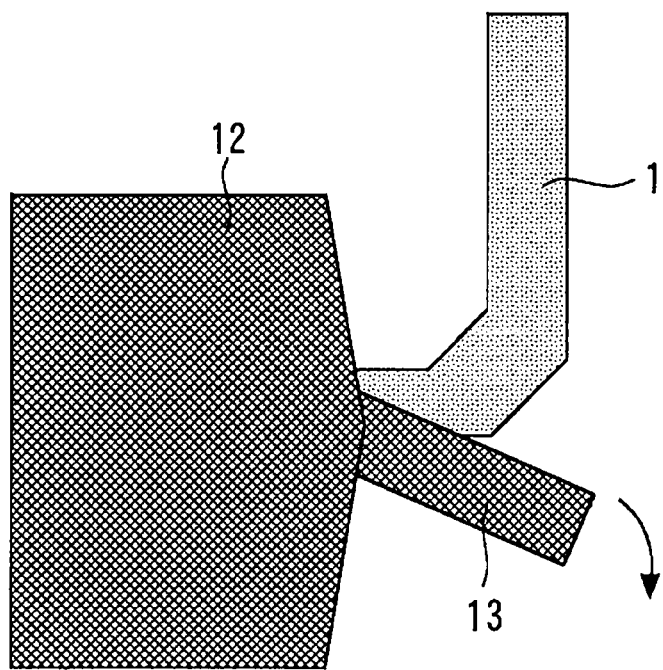
FIG. 13 is a cross-sectional view for illustrating a method of manufacturing a semiconductor device according to a fourth embodiment of the present invention.

FIG. 13 is a cross-sectional view for illustrating a method of manufacturing a semiconductor device according to a fourth embodiment of the present invention. As in the case of the first to third embodiments, after chamfering and resin sealing, the portion provided with the resin burr 13 on the side of the lead frame 1 is bent. This causes stress to be produced in the resin burr 13 attached to the side of the lead frame 1 and thereby makes it easier to remove the resin burr 13.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-017877, filed on Jan. 31, 2011 including specification, claims, drawings and summary, on which the Convention priority of the present application is based, are incorporated herein by reference in its entirety.

What is claimed is:

1. A method of manufacturing a semiconductor device comprising:
preparing a lead frame including a package external region and a package internal region, a burred surface being provided at a top end of a side of the lead frame, and a fracture surface being provided in a vicinity of the top end of the side;

chamfering the top end of the side in the package external region so that at least a surface of the burred surface and a surface of the fracture surface in the package external region are chamfered;

mounting a semiconductor element on the lead frame and sealing the semiconductor element with mold resin in the package internal region; and removing a resin burr provided on the side of the lead frame from at least the surface of the burred surface and the surface of the fracture surface that are chamfered in the package external region, after the chamfering and the sealing.

2. The method of manufacturing a semiconductor device according to claim 1, further comprising chamfering a bottom end of the side of the lead frame.

3. The method of manufacturing a semiconductor device according to claim 1, wherein mold dies are used when the semiconductor element is sealed with mold resin, and the chamfering is simultaneously performed by the mold dies.

4. The method of manufacturing a semiconductor device according to claim 1, further comprising bending a portion provided with the resin burr on the side of the lead frame after the chamfering and the sealing.

5. The method of manufacturing a semiconductor device according to claim 1, wherein the chamfering reduces the fracture surface such that a remaining portion of the fracture surface in the vertical direction is less than or equal to 10% of a thickness of the lead frame.

* * * * *